United States Patent
Lake

(10) Patent No.: US 6,251,211 B1
(45) Date of Patent: *Jun. 26, 2001

(54) CIRCUITRY INTERCONNECTION METHOD

(75) Inventor: Rickie C. Lake, Eagle, ID (US)

(73) Assignee: Micron Technology, Inc., Boise, ID (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/120,849

(22) Filed: Jul. 22, 1998

(51) Int. Cl.$^7$ .............................. H01L 23/48; B32B 31/06
(52) U.S. Cl. .................................. 156/273.3; 156/275.3; 156/275.7; 257/778; 257/781; 257/783; 29/832; 29/841
(58) Field of Search ............................. 156/273.3, 275.1, 156/275.3, 275.7; 257/737, 738, 778, 781, 783; 438/108, 119, 127; 29/832, 841; 361/767, 768, 771

(56) References Cited

U.S. PATENT DOCUMENTS

| | | |
|---|---|---|
| 3,227,605 | 1/1966 | Wolinski . |
| 4,261,800 | 4/1981 | Beckenbaugh et al. ............... 204/15 |
| 4,311,749 | 1/1982 | Hiraiwa et al. . |

(List continued on next page.)

FOREIGN PATENT DOCUMENTS

| | | |
|---|---|---|
| 0 357 802 | 3/1990 | (EP) . |
| 58-098340 | 11/1983 | (JP) . |
| 59-197433 | 11/1984 | (JP) . |
| 06 021620 | 1/1994 | (JP) . |

OTHER PUBLICATIONS

Technical Data Sheet, "MELINEX ST 507 Heat Stabilized Polyester Film", MELINEX Polyester Films, ICI Films, Wilmington, Delaware, #940–27R, 2 Pages (Nov. 1989).
Technical Data Sheet, "MELINEX ST 505 Heat Stabilized Polyester Film", MELINEX Polyester Films, ICI Films, Wilmington, Delaware, #904–25R, 2 Pages (Nov. 1989).

(List continued on next page.)

Primary Examiner—Michael W. Ball
Assistant Examiner—Michael A Tolin
(74) Attorney, Agent, or Firm—Wells, St. John, Roberts, Gregory & Matkin P.S.

(57) ABSTRACT

Electrically conductive polymer bumps are formed in electrical connection with circuitry supported by a first substrate. The polymer bumps are bonded with a conductive adhesive to circuitry supported by a second substrate, with the conductive adhesive being in electrical connection with the circuitry supported by the second substrate. Prior to said bonding, an effective amount of ultraviolet radiation is impinged onto the polymer bumps to enhance adhesion of the bumps with the conductive adhesive and electrical conduction between the circuitry of the first substrate and the circuitry of the second substrate. In one implementation, ultraviolet radiation of at least 340 nm is impinged onto conductive polymer bumps prior to subsequent bonding. In one implementation, ultraviolet radiation is impinged onto conductive polymer bumps for a time period less than one minute prior to subsequent bonding. In one implementation, ultraviolet radiation is impinged onto conductive polymer bumps to provide a total ultraviolet radiation exposure of greater than about 50 mJ/cm$^2$ prior to subsequent bonding. In one implementation, ultraviolet radiation is impinged onto conductive polymer bumps in the absence of ozone other than any produced by said ultraviolet radiation prior to subsequent bonding. In one implementation, ultraviolet radiation is impinged onto conductive polymer bumps in an atmosphere consisting essentially of ambient room air prior to subsequent bonding.

53 Claims, 1 Drawing Sheet

U.S. PATENT DOCUMENTS

| | | | |
|---|---|---|---|
| 4,317,011 | 2/1982 | Mazurk | 200/5 |
| 4,317,013 | 2/1982 | Larson | 200/5 |
| 4,725,924 | 2/1988 | Juan . | |
| 4,843,036 | 6/1989 | Schmidt et al. | 437/224 |
| 4,868,006 | 9/1989 | Yorkgitis et al. | 427/53.1 |
| 5,264,061 | 11/1993 | Juskey et al. | 156/214 |
| 5,264,990 | 11/1993 | Venambre . | |
| 5,296,273 | 3/1994 | Abe et al. | 427/553 |
| 5,302,402 | 4/1994 | Dudenhoeffer et al. | 426/129 |
| 5,427,642 * | 6/1995 | Akiguchi et al. | 156/273.3 |
| 5,434,214 | 7/1995 | Wolosen et al. | 524/720 |
| 5,448,110 | 9/1995 | Tuttle et al. | 257/723 |
| 5,461,202 | 10/1995 | Sera et al. | 174/254 |
| 5,497,140 | 3/1996 | Tuttle . | |
| 5,528,222 | 6/1996 | Moskowitz et al. . | |
| 5,612,513 | 3/1997 | Tuttle et al. | 174/260 |
| 5,682,296 | 10/1997 | Horejs, Jr. et al. . | |
| 5,844,320 * | 12/1998 | Ono et al. | 257/778 |
| 5,987,739 | 11/1999 | Lake . | |
| 6,031,459 | 2/2000 | Lake . | |

OTHER PUBLICATIONS

Technical Data Sheet, "MELINEX 454", MELINEX Polyester Films, ICI Films, Wilmington, Delaware, #904–69R2 2 Pages (Oct. 1994).

Product Guide, "MELINEX Polyester Films", Industrial Films Product Guide, ICI Films, Wilmington, Delaware, #904–76R, 6 Pages (1993).

Product Bulletin, "EPCI R1055–01/H5039", EPIC Resins, a Division of General Fiberglass Supply, Inc., Palmyra, WI 3 Pages (undated).

U.S. Ser. No. 08/596,472, Rickie C. Lake, filed Feb. 5, 1996.

McIntyre & Walzak, New UV/ozone Treatment Improves Adhesiveness of Polymer Surfaces, Modern Plastics, Mar. 1995, pp. 79–81.

Product Information, MERECO—High Technology Materials—MERECO 1650 Series Flexible Epoxy Elastomers, 2 pages.

Standard Test Methods for Flexural Properties of Unreinforced and Reinforced Plastics and Electrical Insulating Materials (Metric), ASTM Designation 790M, pp. 398–410.

* cited by examiner

CIRCUITRY INTERCONNECTION METHOD

TECHNICAL FIELD

This invention relates to circuitry interconnection methods.

BACKGROUND OF THE INVENTION

In many applications, circuitry formed on different substrates needs to be interconnected. One example would be the electrical interconnection of a monolithic integrated circuit chip with another substrate, such as a printed circuit board or a thin polyester sheet having circuit traces printed thereon. For example, U.S. Pat. No. 5,612,513; U.S. Pat. No. 5,987,739; and U.S. Pat. No. 6,031,459 disclose wireless communications devices wherein a semiconductor chip is conductively bonded to a thin polymer sheet having conductive traces including antenna fabricated thereon. Each of these documents is herein incorporated by reference.

Such documents disclose electronic identification systems typically comprising two devices which are configured to communicate with one another via a wireless medium. Such communication systems can be used in various identification functions and other applications. An interrogator is configured to output a polling signal which may comprise a radio frequency signal including a pre-defined code. The transponders of such a communication system are operable to transmit an identification signal responsive to receiving an appropriate command or polling signal. Such communication systems are usable in identification applications such as inventory or other object monitoring. For example, a remote identification device is attached to an object of interest. Responsive to receiving the appropriate polling signal, the identification device is equipped to output an identification signal. Generating the identification signal identifies the presence and/or location of the identification device in the article or object attached thereto.

The majority of the circuitry which carries out these functions is typically fabricated into a monolithic integrated circuit chip. This chip is then bonded to another thin polymer sheet atop which conductive printed thick film ink has been fabricated. The ink includes traces defining an antenna for the device and battery and ancillary circuit interconnections for the monolithic chip effective to achieve the desired functioning.

A preferred method by which the chip is connected to the circuitry of the polymer sheet is by first fabricating conductive polymer bumps on all the desired connection locations, typically referred to as bond pads, on the semiconductor chip. Example material for the conductive polymer bumps is conductive epoxy, such as conductive epoxy part number 116-37A, mixed with hardener B-187 in the proper ratios. Both materials are available from Creative Materials, Incorporated, located in Tyngsboro, Mass. Such bumps are applied by any suitable means over the bonding pads and allowed to essentially completely cure. Thereafter, the secured bumps are bonded with the same or similar conductive epoxy material which has been applied over polymer sheet circuitry where the connection is desired. Thus, a conductive interconnection is made between the chip and other substrate circuitry, with the interconnection also serving as an adhesive interconnect between the chip and thin sheet substrate.

In certain instances, the degree of adhesion achieved in the prior art is less than desirable. Such can accordingly result in less than desired conductivity in the interconnect between the chip and conductive traces of the polymer sheet.

SUMMARY OF INVENTION

The invention comprises circuitry interconnection methods. In one implementation, electrically conductive polymer bumps are formed in electrical connection with circuitry supported by a first substrate. The polymer bumps are bonded with a conductive adhesive to circuitry supported by a second substrate, with the conductive adhesive being in electrical connection with the circuitry supported by the second substrate. Prior to said bonding, an effective amount of ultraviolet radiation is impinged onto the polymer bumps to enhance adhesion of the bumps with the conductive adhesive and electrical conduction between the circuitry of the first substrate and the circuitry of the second substrate.

In one implementation, ultraviolet radiation of at least 340 nm wavelength is impinged onto conductive polymer bumps prior to subsequent bonding. In one implementation, ultraviolet radiation is impinged onto conductive polymer bumps for a time period less than one minute prior to subsequent bonding. In one implementation, ultraviolet radiation is impinged onto conductive polymer bumps to provide a total ultraviolet radiation exposure of greater than about 50 mJ/cm$^2$ prior to subsequent bonding. In one implementation, ultraviolet radiation is impinged onto conductive polymer bumps in the absence of ozone other than any produced by said ultraviolet radiation prior to subsequent bonding. In one implementation, ultraviolet radiation is impinged onto conductive polymer bumps in an atmosphere consisting essentially of ambient room air prior to subsequent bonding.

Other implementations are disclosed and contemplated.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
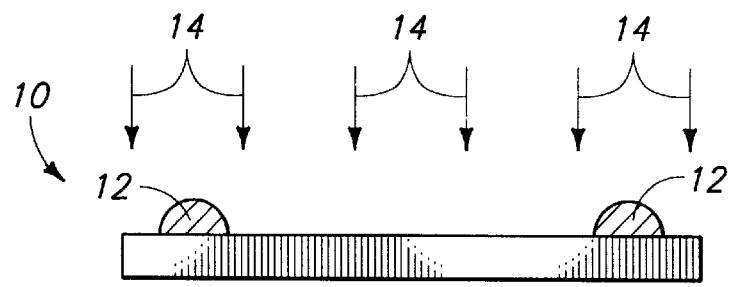
FIG. 1 is a diagrammatic view of a substrate processed in accordance with the invention.

Referring to FIG. 1, a first substrate 10, shown in the preferred form as a monolithic integrated circuit chip, is fabricated to support or define various circuitry. Electrically conductive polymer bumps 12 are formed over desired nodes or bond pads of the circuitry, and are allowed to essentially cure. An example material is as described above. These polymer bumps will be bonded with a conductive adhesive to circuitry supported by a second substrate, which is described below. Prior to said bonding, an effective amount of ultraviolet radiation is impinged onto polymer bumps 12, which in preferred aspects of the invention enhance adhesion of the bumps with the conductive adhesive and electrical conduction between the circuitry of first substrate 10 and the second substrate. Such impinging or exposure to ultraviolet radiation is depicted in FIG. 1 with arrows 14.

The ultraviolet radiation preferably is of a wavelength of at least 340 nanometers and less than about 450 nanometers, with less than about 380 nanometers being more preferred. The total exposure time to the ultraviolet radiation is preferably for a time period less than 1 minute, and even more preferably for a time period less than 1 second. The radiation impinging can occur over a single continuous time interval, or over multiple discrete time intervals. Using multiple discrete intervals which number at least three is preferred. Total ultraviolet radiation exposure is preferably greater than about 50 mJ/cm$^2$, and more preferably also less than about 5 J/cm$^2$, and provided with an ultraviolet radiation peak of greater than 50 mW/cm$^2$. The ultraviolet radiation is preferably impinged onto the polymer bumps in the absence of ozone other than any which might be produced by the ultraviolet radiation itself. Further preferably, such impinging of ultraviolet radiation onto the polymer bumps occurs in an atmosphere consisting essentially of ambient room air.

Figure 2:
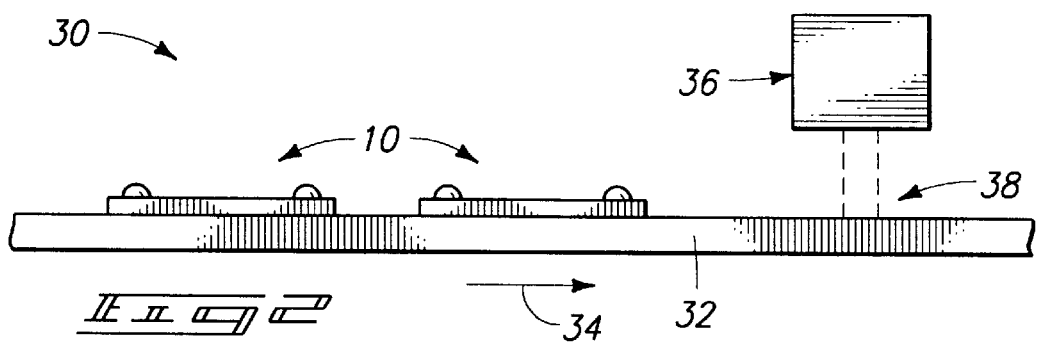
FIG. 2 is a diagrammatic view of substrates being processed in accordance with the invention.

FIG. 2 depicts a preferred method for achieving radiation exposure, such as described with reference to the preferred embodiment of FIG. 1. FIG. 2 illustrates an ultraviolet radiation system 30 comprising a movable belt 32. Such is principally designed to move in a direction of belt travel 34. An ultraviolet light apparatus 36 comprises a suitable ultraviolet lamp capable of producing the desired wavelength ultraviolet radiation, and is configured to impinge ultraviolet radiation onto a region 38 at belt 32, preferably within a range of about 50 watts per linear inch of belt travel in direction 34 to about 600 watts per linear inch of belt travel in direction 34. A plurality of substrates 10 are shown, with their bumps out or up, received on movable belt 32. Belt 32 is then caused to move in the direction of travel 34 to pass the bumps of substrates 10 through region 38, with the ultraviolet lamp system operating.

For example, consider a region 38 which is 1 inch long in the direction of belt travel. Consider also a belt speed of 30 feet per minute. This will provide an exposure time of individual bumps to the ultraviolet radiation of 0.167 seconds. Accordingly if three to four passes through the region are utilized, such as by reversing the direction of belt travel after each pass, total exposure time of from 0.5 to 0.67 seconds will occur.

Figure 3:
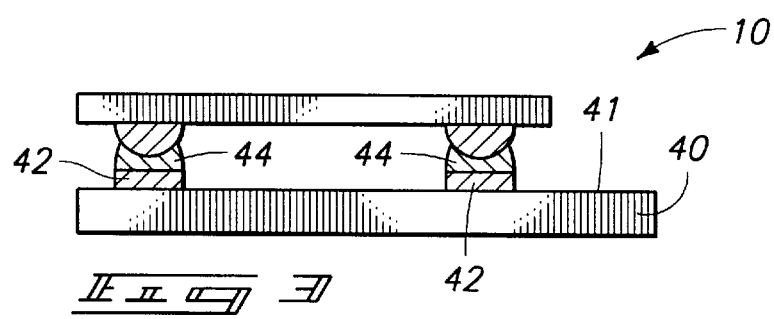
FIG. 3 is a view of a processing step conducted after either FIGS. 1 or 2 in accordance with an aspect of the invention.

Referring to FIG. 3, and after the preferred ultraviolet radiation exposure as described above, substrate 10 is bonded with another substrate for electrically interconnecting the circuitry of both substrates. Specifically, FIG. 3 depicts a second substrate 40 having circuitry supported thereby. Such could, for example, be a polymer thin sheet having conductive ink traces fabricated thereover in accordance with the references disclosed in this document. FIG. 3 illustrates, in a diagrammatic simple manner, exemplary bond pads 42 formed on an outer surface 41 of second substrate 40. A conductive adhesive 44, such as a conductive polymer adhesive for example the same as the conductive bumping material, is preferably applied over bonding pads 42. Prior to such curing and while still in a flowable state, the previously substantially cured bumps of substrate 10 are engaged with the flowable conductive adhesive. Subsequent curing, either at room temperature or at elevated temperatures, results in a cured electrical interconnection and adherence of substrate 10 relative to substrate 40.

Figure 4:
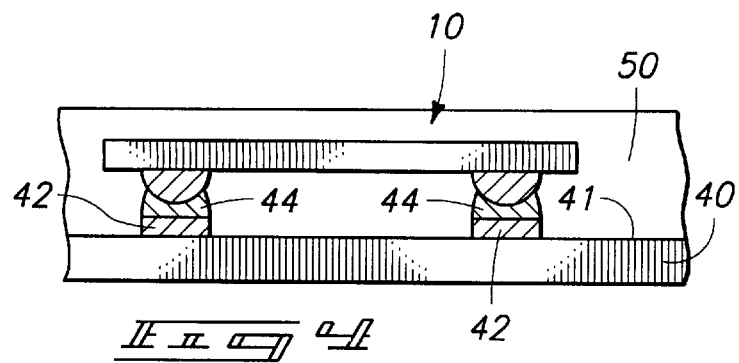
FIG. 4 is a view of a processing step subsequent to that depicted by FIG. 3.

Referring to FIG. 4, a liquid polymer encapsulant 50 is provided over first substrate 10 and at least one surface 41 of second substrate 40, and is cured into a solid mass. Further preferably, an effective amount of ultraviolet radiation has preferably been impinged or applied onto surface 41 to enhance adhesion of the encapsulant to surface 41 as described in the Ser. No. 08/596,472 reference above.

In the preferred embodiments, exposing the conductive polymer bumps to an ultraviolet light source is found to enhance both adhesion and conductivity of the interconnect. Ultraviolet light source exposure in accordance with the invention is a simple, low-cost, and highly effective approach to improving conductive polymer bump adhesion in accordance with preferred aspects of the invention, and is cheaper and more effective than many prior art methods.

The following examples demonstrating improved adhesion of conductive polymer bumps using ultraviolet radiation.

EXAMPLE 1

Conductive polymer bumps comprising conductive epoxy part number 116-37A, mixed with hardener B-187 in the proper ratios, available from Creative Materials, Incorporated, located in Tyngsboro, Mass., are formed over three different substrates. Such substrates with bumps are processed or passed through an ultraviolet light system for exposure to ultraviolet light radiation. The ultraviolet light system is a SPE UV System—Model available from Screen Printing Enterprises having a place of business at Newport, Calif. The ultraviolet light system is operated at 200 watts per inch at a belt speed of 30 feet per minute. The ultraviolet lamp of the SPE UV System is operated at 200 watts per linear inch across the conveyor belt and is de-focused from the belt slightly to provide high intensity light all across the entire conveyor belt, and is approximately one inch in depth or direction of belt travel. This system is operated in a range of about 50 watts per linear inch to about 600 watts per linear inch. The three substrates are passed through the light exposure region a respective one, two and three times. After exposure, the bumps of each substrate are bonded with conductive adhesive, of the same material as the bumps, with a second substrate which electrically connects the circuitry of both substrates. Another control substrate is utilized having epoxy bumps not exposed to ultraviolet radiation as described.

The adhesion of the conductive polymer bumps, and accordingly the first substrate to the second substrate of the control application, is measured, along with the conductivity of the interconnect. Both adhesion levels and conductivity improve measurably and significantly on those three substrates having increasing number of passes through the ultraviolet light unit.

EXAMPLE 2

In a manner similar to Example 1, multiple substrates having exposed epoxy bumps are passed through the SPE UV ultraviolet light system. The profile within the system includes, energy of 643.60 mJ/cm$^2$, a peak energy of 280 mW/cm$^2$, an average energy of 90.01 mW/cm$^2$ and a peak temperature of 116.8° C. Epoxy bumps are exposed three to four times to this profile, with such providing significant increases in adhesion and conductance compared to a control substrate.

EXAMPLE 3

In a similar manner as described in Example 2, multiple substrates are passed through a LESCO Ultraviolet Light Curing System, available from LESCO Incorporated, Light Wave Energy Systems Company, Redondo Beach, Calif. Such system is equipped with a Fusion Systems Corporation F300-18 "D" type bulbs. The following data regarding the ultraviolet light intensity and temperature profile is used with respect to the ultraviolet light exposure per pass through the system. This profile includes ultraviolet light energy of 1.48 J/cm$^2$; peak energy of 468.00 mW/cm$^2$; average energy of 158.08 mW/cm$^2$; and peak temperature of 72.0° C. Operating at this profile, the conductive polymer bumps of the substrate passed only once through the system have considerably improved adhesion.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A circuitry interconnection method comprising:
   forming electrically conductive polymer bumps in electrical connection with circuitry supported by a first substrate;
   bonding the polymer bumps with a conductive adhesive to circuitry supported by a second substrate, the conductive adhesive being in electrical connection with the circuitry supported by the second substrate; and
   prior to said bonding, impinging an effective amount of ultraviolet radiation onto the polymer bumps to enhance adhesion of the bumps with the conductive adhesive and electrical conduction between the circuitry of the first substrate and the circuitry of the second substrate.

2. The method of claim 1 comprising applying a liquid polymer encapsulant over the first substrate and at least one surface of the second substrate and curing said encapsulant into a solid mass; and prior to said applying, impinging an effective amount of ultraviolet ration onto the one surface to enhance adhesion of the encapsulant to the one surface.

3. The method of claim 1 wherein the first substrate comprises a monolithic integrated circuit chip and the second substrate comprises a polymer sheet.

4. The method of claim 2 wherein the first substrate comprises a monolithic integrated circuit chip and the second substrate comprises a polymer sheet.

5. A circuitry interconnection method comprising:
   forming electrically conductive polymer bumps in electrical connection with circuitry supported by a first substrate;
   impinging ultraviolet radiation of at least 340 nm wavelength onto the polymer bumps; and
   after the impinging, bonding the polymer bumps with a conductive adhesive to circuitry supported by a second substrate, the conductive adhesive being in electrical connection with the circuitry supported by the second substrate.

6. The method of claim 5 comprising applying a liquid polymer encapsulant over the first substrate and at least one surface of the second substrate and curing said encapsulant into a solid mass; and prior to said applying, impinging an effective amount of ultraviolet ration onto the one surface to enhance adhesion of the encapsulant to the one surface.

7. The method of claim 5 wherein the radiation is impinged to an amount effective to enhance adhesion of the bumps with the conductive adhesive and electrical conduction between the circuitry of the first substrate and the circuitry of the second substrate.

8. The method of claim 5 wherein the ultraviolet radiation wavelength is less than about 450 nm.

9. The method of claim 5 wherein the ultraviolet radiation wavelength is less than about 380 nm.

10. The method of claim 5 wherein the time period of impinging is less than 1 minute.

11. The method of claim 5 wherein the conductive bumps are exposed to a total ultraviolet radiation dose of greater than 50 mJ/cm$^2$.

12. The method of claim 5 wherein the impinging occurs in the absence of ozone other than any produced by said ultraviolet radiation.

13. The method of claim 5 wherein the impinging occurs in an atmosphere consisting essentially of ambient room air.

14. A circuitry interconnection method comprising:
   forming electrically conductive polymer bumps in electrical connection with circuitry supported by a first substrate;
   impinging ultraviolet radiation onto the polymer bumps for a time period less than 1 minute; and
   after the impinging, bonding the polymer bumps with a conductive adhesive to circuitry supported by a second substrate, the conductive adhesive being in electrical connection with the circuitry supported by the second substrate.

15. The method of claim 14 comprising applying a liquid polymer encapsulant over the first substrate and at least one surface of the second substrate and curing said encapsulant into a solid mass; and prior to said applying, impinging an effective amount of ultraviolet radiation onto the one surface to enhance adhesion of the encapsulant to the one surface.

16. The method of claim 14 wherein the radiation is impinged to an amount effective to enhance adhesion of the bumps with the conductive adhesive and electrical conduction between the circuitry of the first substrate and the circuitry of the second substrate.

17. The method of claim 14 wherein the time period is less than 1 second.

18. The method of claim 14 wherein the impinging occurs over multiple discrete time intervals.

19. The method of claim 14 wherein the impinging occurs over at least 3 discrete time intervals.

20. The method of claim 14 wherein the conductive bumps are exposed to a total ultraviolet radiation dose of greater than 50 mJ/cm$^2$.

21. The method of claim 14 wherein the impinging occurs in the absence of ozone other than any produced by said ultraviolet radiation.

22. The method of claim 14 wherein the impinging occurs in an atmosphere consisting essentially of ambient room air.

23. A circuitry interconnection method comprising:
   forming electrically conductive polymer bumps in electrical connection with circuitry supported by a first substrate;
   impinging ultraviolet radiation onto the polymer bumps to provide a total ultraviolet radiation exposure of greater than about 50 mJ/cm$^2$; and
   after the impinging, bonding the polymer bumps with a conductive adhesive to circuitry supported by a second substrate, the conductive adhesive being in electrical connection with the circuitry supported by the second substrate.

24. The method of claim 23 comprising applying a liquid polymer encapsulant over the first substrate and at least one surface of the second substrate and curing said encapsulant into a solid mass; and prior to said applying, impinging an effective amount of ultraviolet radiation onto the one surface to enhance adhesion of the encapsulant to the one surface.

25. The method of claim 23 wherein the radiation is impinged to an amount effective to enhance adhesion of the bumps with the conductive adhesive and electrical conduction between the circuitry of the first substrate and the circuitry of the second substrate.

26. The method of claim 23 wherein the total ultraviolet radiation exposure is less than about 5 J/cm$^2$.

27. The method of claim 23 wherein the impinging provides an ultraviolet radiation peak of greater than 50 mW/cm$^2$.

28. The method of claim 23 wherein the total ultraviolet radiation exposure is less than about 5 J/cm$^2$, and provides an ultraviolet radiation peak of greater than 50 mW/cm$^2$.

29. The method of claim 23 wherein the impinging occurs in the absence of ozone other than any produced by said ultraviolet radiation.

30. The method of claim 23 wherein the impinging occurs in an atmosphere consisting essentially of ambient room air.

31. A circuitry interconnection method comprising:
    forming electrically conductive polymer bumps in electrical connection with circuitry supported by a first substrate;
    impinging ultraviolet radiation onto the polymer bumps in the absence of ozone other than any produced by said ultraviolet radiation; and
    after the impinging, bonding the polymer bumps with a conductive adhesive to circuitry supported by a second substrate, the conductive adhesive being in electrical connection with the circuitry supported by the second substrate.

32. The method of claim 31 comprising applying a liquid polymer encapsulant over the first substrate and at least one surface of the second substrate and curing said encapsulant into a solid mass; and prior to said applying, impinging an effective amount of ultraviolet radiation onto the one surface to enhance adhesion of the encapsulant to the one surface.

33. The method of claim 31 wherein the radiation is impinged to an amount effective to enhance adhesion of the bumps with the conductive adhesive and electrical conduction between the circuitry of the first substrate and the circuitry of the second substrate.

34. A circuitry interconnection method comprising:
    forming electrically conductive polymer bumps in electrical connection with circuitry supported by a first substrate;
    impinging ultraviolet radiation onto the polymer bumps in an atmosphere consisting essentially of ambient room air; and
    after the impinging, bonding the polymer bumps with a conductive adhesive to circuitry supported by a second substrate, the conductive adhesive being in electrical connection with the circuitry supported by the second substrate.

35. The method of claim 34 comprising applying a liquid polymer encapsulant over the first substrate and at least one surface of the second substrate and curing said encapsulant into a solid mass; and prior to said applying, impinging an effective amount of ultraviolet radiation onto the one surface to enhance adhesion of the encapsulant to the one surface.

36. The method of claim 34 wherein the radiation is impinged to an amount effective to enhance adhesion of the bumps with the conductive adhesive and electrical conduction between the circuitry of the first substrate and the circuitry of the second substrate.

37. A circuitry interconnection method comprising:
    forming electrically conductive polymer bumps in electrical connection with circuitry supported by a first substrate;
    impinging ultraviolet radiation of at least 340 nm wavelength onto the polymer bumps to provide a total ultraviolet radiation exposure of at least about 50 mJ/cm$^2$ over a time period of no greater than 1 minute in an atmosphere consisting essentially of ambient room air; and
    after the impinging, bonding the polymer bumps with a conductive adhesive to circuitry supported by a second substrate, the conductive adhesive being in electrical connection with the circuitry supported by the second substrate.

38. The method of claim 37 wherein the ultraviolet radiation wavelength is less than about 450 nm.

39. The method of claim 37 wherein the ultraviolet radiation wavelength is less than about 380 nm.

40. The method of claim 37 wherein the time period is less than 1 second.

41. The method of claim 37 wherein the impinging occurs over multiple discrete time intervals.

42. The method of claim 37 wherein the impinging occurs over at least 3 discrete time intervals.

43. The method of claim 37 wherein the total ultraviolet radiation exposure is less than about 5 J/cm$^2$.

44. The method of claim 37 wherein the impinging provides an ultraviolet radiation peak of greater than 50 mW/cm$^2$.

45. The method of claim 37 wherein the total ultraviolet radiation exposure is less than about 5 J/cm$^2$, and provides an ultraviolet radiation peak of greater than 50 mW/cm$^2$.

46. A circuitry interconnection method comprising:
    forming electrically conductive polymer bumps in electrical connection with circuitry supported by a first substrate;
    providing the first substrate, bumps out, onto a movable belt of an ultraviolet light radiation system;
    operating an ultraviolet lamp of the system onto a region of the belt within a range of about 50 Watts per linear inch in a direction of belt travel to about 600 Watts per linear inch in the direction;
    moving the belt to pass the bumps of the first substrate through the region with the ultraviolet lamp operating; and
    after passing the bumps through the region, bonding the polymer bumps with a conductive adhesive to circuitry supported by a second substrate, the conductive adhesive being in electrical connection with the circuitry supported by the second substrate.

47. The method of claim 46 comprising applying a liquid polymer encapsulant over the first substrate and at least one surface of the second substrate and curing said encapsulant into a solid mass; and prior to said applying, impinging an effective amount of ultraviolet radiation onto the one surface to enhance adhesion of the encapsulant to the one surface.

48. The method of claim 46 wherein the radiation is impinged to an amount effective to enhance adhesion of the bumps with the conductive adhesive and electrical conduction between the circuitry of the first substrate and the circuitry of the second substrate.

49. The method of claim 46 wherein the time period of impinging is less than 1 minute.

50. The method of claim 46 wherein the conductive bumps are exposed to a total ultraviolet radiation dose of greater than 50 mJ/cm$^2$.

51. The method of claim 46 wherein the impinging occurs in the absence of ozone other than any produced by said ultraviolet radiation.

52. The method of claim 46 wherein the impinging occurs in an atmosphere consisting essentially of ambient room air.

53. The method of claim 46 wherein wavelength of the ultraviolet radiation is at least 340 nm.

* * * * *